US009263078B2

(12) United States Patent
Verhaverbeke et al.

(10) Patent No.: US 9,263,078 B2
(45) Date of Patent: *Feb. 16, 2016

(54) PATTERNING OF MAGNETIC THIN FILM USING ENERGIZED IONS

(71) Applicant: Applied Materials, Inc., Santa Clara, CA (US)

(72) Inventors: Steven Verhaverbeke, San Francisco, CA (US); Omkaram Nalamasu, San Jose, CA (US); Majeed A. Foad, Sunnyvale, CA (US); Mahalingam Venkatesan, San Jose, CA (US); Nety M. Krishna, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 325 days.

This patent is subject to a terminal disclaimer.

(21) Appl. No.: 14/029,248

(22) Filed: Sep. 17, 2013

(65) Prior Publication Data

US 2014/0017518 A1 Jan. 16, 2014

Related U.S. Application Data

(62) Division of application No. 12/255,833, filed on Oct. 22, 2008, now Pat. No. 8,535,766.

(51) Int. Cl.
*C23C 14/48* (2006.01)
*C23C 14/04* (2006.01)
(Continued)

(52) U.S. Cl.
CPC ............. *G11B 5/84* (2013.01); *C23C 14/185* (2013.01); *C23C 14/48* (2013.01); *C23C 14/5826* (2013.01); *C23C 14/5833* (2013.01); *G11B 5/855* (2013.01); *H01J 2237/3365* (2013.01)

(58) Field of Classification Search
CPC ........ G11B 5/84; G11B 5/855; C23C 14/185; C23C 14/48; C23C 14/5826; C23C 14/5833; C23C 14/855; H01J 2237/3365
USPC .................. 427/523–531, 533–535, 128–132
See application file for complete search history.

(56) References Cited

U.S. PATENT DOCUMENTS 4,991,542 A 2/1991 Kohmura et al.
5,296,995 A 3/1994 Yonezawa et al.
(Continued)

FOREIGN PATENT DOCUMENTS

CN 101243544 A 8/2008
EP 1055745 A1 11/2000
(Continued)

OTHER PUBLICATIONS

Non-Final Office Action dated Sep. 19, 2014 for U.S. Appl. No. 12/355,612.
(Continued)

*Primary Examiner* — Marianne L Padgett
(74) *Attorney, Agent, or Firm* — Patterson & Sheridan, LLP

(57) ABSTRACT

A method for patterning a magnetic thin film on a substrate includes: providing a pattern about the magnetic thin film, with selective regions of the pattern permitting penetration of energized ions of one or more elements. Energized ions are generated with sufficient energy to penetrate selective regions and a portion of the magnetic thin film adjacent the selective regions. The substrate is placed to receive the energized ions. The portions of the magnetic thin film are rendered to exhibit a magnetic property different than selective other portions. A method for patterning a magnetic media with a magnetic thin film on both sides of the media is also disclosed.

5 Claims, 11 Drawing Sheets

(51) Int. Cl.
*G11B 5/84* (2006.01)
*C23C 14/58* (2006.01)
*C23C 14/18* (2006.01)
*G11B 5/855* (2006.01)

(56) References Cited

U.S. PATENT DOCUMENTS

| | | | |
|---|---|---|---|
| 5,640,343 A | 6/1997 | Gallagher et al. | |
| 5,763,016 A | 6/1998 | Levenson et al. | |
| 5,858,477 A | 1/1999 | Veerasamy et al. | |
| 6,101,972 A | 8/2000 | Bluck et al. | |
| 6,128,214 A | 10/2000 | Kuekes et al. | |
| 6,153,281 A | 11/2000 | Meyer et al. | |
| 6,157,523 A | 12/2000 | Kikuchi et al. | |
| 6,168,845 B1 | 1/2001 | Fontana, Jr. et al. | |
| 6,202,592 B1 | 3/2001 | Nozawa et al. | |
| 6,203,862 B1 | 3/2001 | Bluck et al. | |
| 6,252,741 B1 | 6/2001 | Ahn | |
| 6,331,364 B1 | 12/2001 | Baglin et al. | |
| 6,368,678 B1 | 4/2002 | Bluck et al. | |
| 6,377,414 B1 | 4/2002 | Wang | |
| 6,383,597 B1 | 5/2002 | Fullerton et al. | |
| 6,391,430 B1 | 5/2002 | Fullerton et al. | |
| 6,500,497 B1 | 12/2002 | Wang et al. | |
| 6,571,729 B2 | 6/2003 | Sasaki et al. | |
| 6,749,729 B1 | 6/2004 | Xu et al. | |
| 6,753,043 B1 | 6/2004 | Kuo et al. | |
| 6,849,349 B2 | 2/2005 | Klemmer et al. | |
| 6,849,558 B2 | 2/2005 | Schaper | |
| 6,864,042 B1 | 3/2005 | Kuo et al. | |
| 6,876,574 B2 | 4/2005 | Giebeler et al. | |
| 6,898,031 B1 | 5/2005 | Belser et al. | |
| 6,947,235 B2 | 9/2005 | Albrecht et al. | |
| 7,160,477 B2 | 1/2007 | Bandic et al. | |
| 7,190,049 B2 | 3/2007 | Tuominen et al. | |
| 7,288,491 B2 | 10/2007 | Collins et al. | |
| 7,291,545 B2 | 11/2007 | Collins et al. | |
| 7,294,294 B1 | 11/2007 | Wago et al. | |
| 7,686,972 B2 | 3/2010 | Hieda et al. | |
| 8,535,766 B2 * | 9/2013 | Verhaverbeke | C23C 14/185 427/130 |
| 8,551,578 B2 * | 10/2013 | Nalamasu | B82Y 10/00 427/130 |
| 8,586,952 B2 * | 11/2013 | Hilkene | B82Y 10/00 250/492.1 |
| 8,634,155 B2 * | 1/2014 | Yasumori | B82Y 10/00 360/135 |
| 8,673,162 B2 * | 3/2014 | Gouk | G11B 5/8404 216/22 |
| 9,059,398 B2 * | 6/2015 | Kim | H01L 43/12 |
| 2003/0019739 A1 | 1/2003 | Shibamoto et al. | |
| 2003/0113524 A1 | 6/2003 | Klemmer et al. | |
| 2003/0129850 A1 | 7/2003 | Olgado et al. | |
| 2003/0176034 A1 | 9/2003 | Jackson et al. | |
| 2004/0113175 A1 | 6/2004 | Motoyoshi et al. | |
| 2004/0157086 A1 | 8/2004 | Hwang et al. | |
| 2004/0191557 A1 | 9/2004 | Kamata et al. | |
| 2004/0259036 A1 | 12/2004 | Chappert et al. | |
| 2005/0079647 A1 | 4/2005 | Abraham et al. | |
| 2005/0260773 A1 | 11/2005 | Hong et al. | |
| 2006/0019039 A1 | 1/2006 | Hanawa et al. | |
| 2006/0172153 A1 | 8/2006 | Kikitsu et al. | |
| 2006/0222897 A1 | 10/2006 | Kamata et al. | |
| 2006/0222898 A1 | 10/2006 | Ichihara | |
| 2006/0280861 A1 | 12/2006 | Shirotori et al. | |
| 2006/0286368 A1 | 12/2006 | Albrecht et al. | |
| 2007/0003798 A1 | 1/2007 | Naito et al. | |
| 2007/0036910 A1 | 2/2007 | Marinero et al. | |
| 2007/0132152 A1 | 6/2007 | Choi et al. | |
| 2007/0178609 A1 | 8/2007 | Yoda | |
| 2008/0157911 A1 | 7/2008 | Fajardo et al. | |
| 2008/0185567 A1 | 8/2008 | Kumar et al. | |
| 2008/0218772 A1 | 9/2008 | Binns et al. | |
| 2009/0201722 A1 | 8/2009 | Giridhar et al. | |
| 2009/0323219 A1 | 12/2009 | Fukushima et al. | |
| 2010/0053797 A1 | 3/2010 | Fukushima et al. | |
| 2010/0053813 A1 | 3/2010 | Fukushima et al. | |
| 2010/0096256 A1 | 4/2010 | Nalamasu et al. | |
| 2010/0098873 A1 | 4/2010 | Verhaverbeke et al. | |
| 2010/0165504 A1 | 7/2010 | Fukushima et al. | |
| 2010/0221583 A1 | 9/2010 | Foad et al. | |
| 2010/0258431 A1 | 10/2010 | Moffatt et al. | |
| 2010/0258758 A1 | 10/2010 | Foad et al. | |
| 2010/0260943 A1 * | 10/2010 | Hertel | C23C 14/48 427/523 |
| 2010/0261040 A1 | 10/2010 | Foad et al. | |
| 2011/0032635 A1 | 2/2011 | Fukushima | |
| 2011/0059235 A1 | 3/2011 | Fukushima et al. | |
| 2011/0101247 A1 | 5/2011 | Hilkene et al. | |
| 2011/0104393 A1 | 5/2011 | Hilkene et al. | |
| 2011/0109992 A1 | 5/2011 | Fukushima | |
| 2011/0261040 A1 | 10/2011 | Han et al. | |
| 2012/0196155 A1 | 8/2012 | Bencher et al. | |
| 2012/0237798 A1 | 9/2012 | Iwasaki et al. | |

FOREIGN PATENT DOCUMENTS

| | | |
|---|---|---|
| JP | 02230533 A | 9/1990 |
| JP | H03-56668 | 3/1991 |
| JP | 6104172 A | 4/1994 |
| JP | 2000-298825 A | 10/2000 |
| JP | 2001-192826 A | 7/2001 |
| JP | 2001-250217 A | 9/2001 |
| JP | 2002-288813 A | 10/2002 |
| JP | 2002-359138 A | 12/2002 |
| JP | 2004185752 A | 7/2004 |
| JP | 2005-117021 A | 4/2005 |
| JP | 2005-147661 A | 6/2005 |
| JP | 2005-158095 A | 6/2005 |
| JP | 2005-539396 A | 12/2005 |
| JP | 2006-309841 A | 11/2006 |
| JP | 2007-220203 A | 8/2007 |
| JP | 2007-531269 A | 11/2007 |
| JP | 2008-052860 A | 3/2008 |
| JP | 2008077756 A | 4/2008 |
| JP | 2008-183681 A | 8/2008 |
| JP | 2008-226428 A | 9/2008 |
| JP | 2009026435 A | 2/2009 |
| JP | 2009-199692 A | 9/2009 |
| JP | 2010134975 A | 6/2010 |
| JP | 2011-518400 A | 6/2011 |
| KR | 100790474 B1 | 1/2008 |
| KR | 20090011519 U | 11/2009 |
| TW | 234759 | 11/1994 |
| TW | 275123 | 5/1996 |
| WO | WO-2004027460 A2 | 4/2004 |
| WO | 2005-104186 A2 | 11/2005 |

OTHER PUBLICATIONS

Japanese Office Action dated Feb. 4, 2014 for Japanese Patent Application No. 2011-533240.
Taiwan Office Action dated Feb. 5, 2014 for Application No. 98135648.
Japanese Office Action dated Mar. 10, 2015 for Application No. JP 2014-114835.
International Search Report dated Aug. 28, 2009 for International Application No. PCT/US2009/033819.
Dietzel et al., "Ion Projection Direct Structuring for Patterning of Magnetic Media", IEEE Transactions on Magnetics, vol. 38, No. 5, Sep. 2002, pp. 1952-1954.
International Search Report and Written Opinion dated May 19, 2010 for International Application No. PCT/US2009/060868.
International Search Report and Written Opinion of the International Searching Authority mailed Sep. 15, 2010 in PCT/US2010/024163.
Office Action dated Mar. 13, 2012 for U.S. Appl. No. 12/255,865.
Final Office Action for U.S. Appl. No. 12/029,601 dated Oct. 10, 2012.
Final Office Action for U.S. Appl. No. 12/355,612 dated Oct. 10, 2012.
Office Action for U.S. Appl. No. 12/255,865 dated Mar. 26, 2013.
Chappert et al., "Planner Patterned Magnetic Media Obtained by Ion Irradiation", Science, vol. 280, Jun. 19, 1989, pp. 1919-1922.

(56) References Cited

OTHER PUBLICATIONS

Huang et al., "Irradiation-controlled GMR of PtMn-based Spin Valve", 50th Annual Conference on Magnetism and Magnetic Materials, San Jose, California, Oct. 30-Nov. 3, 2005.

Mougin et al., "Local Manipulation and Reversal of the Exchange Bias Field by Ion Irradiation in FeNi/FeMn double Layers", Physical Review B (rapid communications), vol. 63, 060409 (R), pp. 060409-1 to 060409-4, Jan. 23, 2001.

Gallagher, et al. "Development of the magnetic tunnel junction MRAM at IBM: From first junctions to a 16-Mb MRAM demonstrator chip," IBM J Res. & Dev., vol. 50, No. 1, Jan. 2006, pp. 5-23.

Maffitt et al. "Design considerations for MRAM," IBM J. Res. & Dev., vol. 50, No. 1, Jan. 2006, pp. 25-39.

Chinese Office Action dated May 22, 2013 for Chinese Patent Application No. 200980142620.6.

Office Action and Search Report for Chinese Application No. 201210397232.6 dated Aug. 29, 2014.

Chinese Office Action dated Nov. 18, 2013 for Chinese Patent Application No. 200980142620.6.

Korean Office Action dated Aug. 17, 2015 for Application No. 10-2011-7011703, includes a summary in English.

* cited by examiner

PATTERNING OF MAGNETIC THIN FILM USING ENERGIZED IONS

CROSS-REFERENCE TO RELATED APPLICATIONS

This application includes subject matter related to U.S. patent application Ser. No. 12/029,601 filed on Feb. 12, 2008 and entitled "Magnetic Domain Patterning Using Plasma Ion Implantation" which is incorporated herein by reference.

This application is a divisional of co-pending U.S. patent application Ser. No. 12/255,833, filed Oct. 22, 2008, now U.S. Pat. No. 8,535,766. The aforementioned related patent application is herein incorporated by reference.

BACKGROUND OF THE INVENTION

Field of the Invention

The present invention relates generally to patterning of magnetic thin film, and more particularly to a method of patterning magnetic thin film of a magnetic recording medium, using energized ions.

There is an ever present need for higher density information storage media for computers. Currently, the prevalent storage media is the hard disk drive (HDD). An HDD is a non-volatile storage device which stores digitally encoded data on rapidly rotating disks with magnetic surfaces. The disks are circular, with a central hole. The disks are made from a non-magnetic material, usually glass or aluminum, and are coated on one or both sides with magnetic thin films, such as cobalt-based alloy thin films. HDDs record data by magnetizing regions of the magnetic film with one of two particular orientations, allowing binary data storage in the film. The stored data is read by detecting the orientation of the magnetized regions of the film.

A typical HDD design consists of a spindle which holds one or more disks, spaced sufficiently apart to allow read-write heads to access one or both sides of one or more disks. The disks are fixed to the spindle by clamps inserted into the central holes in the disks. The disks are spun at very high speeds. Information is written onto and read off a disk as it rotates past the read-write heads. The heads move in very close proximity to the surface of the magnetic thin film. The read-write head is used to detect and/or modify the magnetization of the material immediately underneath it. There is one head for each magnetic disk surface on the spindle. An arm moves the heads across the spinning disks, allowing each head to access almost the entire surface of a corresponding disk.

In a conventional magnetic media, each bit cell includes a plurality of magnetic grains randomly dispersed. Ideally, the plurality of magnetic grains are physically separated from each other so as to provide improved write-ability, signal to noise ratio (SNR) and thermal stability.

As the aerial density of magnetic recording media increases, number of bit cells per square inch increases. This reduces the size of the bit cell. To effectively measure a transition, a minimum number of magnetic grains are required in a bit cell. As the size of a bit cell reduces, the magnetic grain size has to be correspondingly reduced to provide a minimum number of magnetic grains in the bit cell. If isolation of magnetic grains and reduction in magnetic grain size are advanced to ensure low noise, the recording density will be limited because of thermal disturbances.

For improvement of a recording density, it is desirable to reduce a recording cell size on a media, which brings about reduction in signal magnetic field intensity generated from the media. In order to meet the SNR required for a recording system, noise must be reduced corresponding to reduction in signal intensity. The media noise is mainly caused by fluctuation of a magnetization transition, and the fluctuation is proportional to a size of a magnetization reversal unit made of magnetic grains. Therefore, in order to reduce the media noise, it is required to isolate magnetic grains by disrupting exchange interaction between magnetic grains.

Magnetic energy of a single isolated magnetic grain is given by a product of magnetic anisotropy energy density and volume of the grain. It is desirable to reduce the media thickness in order to reduce a magnetization transition width. It is also desirable to reduce the grain size in order to meet a requirement for low noise. Reduced magnetic grain size significantly lowers the volume of magnetic grain, and further significantly lowers magnetic energy of the grain. If the magnetic energy of a given magnetic grain in a magnetic media is several hundred times the thermal energy at an operating temperature (for example, at room temperature), resistance against thermal disturbance is considered to be sufficient. However, if the magnetic energy of the magnetic grain is less than a hundred times the thermal energy, there is a possibility that the magnetization direction of the magnetic grain may be reversed by thermal disturbance, potentially leading to loss of recorded information.

Various alternatives have been proposed to overcome the problem of thermal disturbances. One alternative is to use a magnetic material with high magnetic anisotropy. These magnetic materials need higher recording saturation magnetic field from a head to write the magnetic media. Another alternative is to use thermally assisted recording, where a highly anisotropic magnetic material is used and a recording portion is heated by light irradiation during recording. The heat lowers the anisotropy of magnetic grains and the recording saturation magnetic field. This permits writing of the magnetic media with conventional magnetic head.

As the aerial density increases, there are a minimum number of magnetic grains that are still required per bit cell and there is a limitation on how small a magnetic grain can be practically achieved.

An alternate magnetic media that is being explored is a patterned media, where magnetic portions alternate with non-magnetic portions. For example, a bit patterned media may have magnetic portions defining a magnetic domain as islands surrounded by non-magnetic portions. A track patterned media may have for example, a concentric track of magnetic portions separated by non-magnetic portions.

Various alternatives have been proposed to manufacture these media, however there still remains a need to come up with a method that is cost effective and compatible with high volume manufacturing. It is in this context that the embodiments of this disclosure arise.

SUMMARY OF THE INVENTION

The concepts and methods of this disclosure allow for high volume manufacturing of magnetic media with some portions of the magnetic thin film rendered to exhibit a magnetic property different than other portions of the magnetic thin film.

In one aspect, the present disclosure is a method of patterning a magnetic thin film on a substrate. The method includes providing a pattern about the magnetic thin film, with selective regions of the pattern permitting penetration of energized ions of one or more elements through and impinges upon portions of the magnetic thin film. Energized ions of one or more elements are generated with sufficient energy to penetrate selective regions of the pattern and a portion of the magnetic thin film adjacent the selective regions. The substrate is placed to receive the energized ions. The portions of the magnetic thin film adjacent the selective regions are rendered to exhibit a magnetic property different than selective other portions of the magnetic thin film.

In another aspect, the present disclosure is a method for patterning a magnetic media having two sides with a magnetic thin film on both sides. The method includes, providing a pattern about the magnetic thin film on both sides of the magnetic media, with selective regions of the pattern permitting penetration of energized ions of one or more elements through and impinge upon portions of the magnetic thin film. Energized ions of one or more elements are generated with sufficient energy to penetrate selective regions of the pattern and a portion of the magnetic thin film adjacent the selective regions on both sides of the magnetic media. The magnetic media is placed to receive energized ions. The portions of the magnetic thin film adjacent the selective regions on both sides of the magnetic media are rendered to exhibit a magnetic property different than selective other portions of the magnetic thin film.

BRIEF DESCRIPTION OF THE DRAWINGS

These and other aspects and features of the present invention will become apparent to those ordinarily skilled in the art upon review of the following description of specific embodiments of the invention in conjunction with the accompanying figures, wherein.

DETAILED DESCRIPTION

The present disclosure will now be described in detail with reference to the drawings, which are provided as illustrative examples of the disclosure so as to enable those skilled in the art to practice the disclosure. Notably, the figures and examples below are not meant to limit the scope of the present disclosure to a single embodiment, but other embodiments are possible by way of interchange of some or all of the described or illustrated elements. Moreover, where certain elements of the present disclosure can be partially or fully implemented using known components, only those portions of such known components that are necessary for an understanding of the present disclosure will be described, and detailed descriptions of other portions of such known components will be omitted so as not to obscure the disclosure. In the present specification, an embodiment showing a singular component should not be considered limiting; rather, the disclosure is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present disclosure encompasses present and future known equivalents to the known components referred to herein by way of illustration.

In general, the present disclosure contemplates providing a pattern with selective regions permitting penetration of ions of one or more elements through and impinges upon portions of a magnetic thin film. Energized ions of one or more elements are generated with sufficient energy to penetrate selective regions of the pattern and a portion of the magnetic thin film adjacent the selective region. The substrate is placed to receive the energized ions. Portions of the magnetic thin film adjacent the selective regions are rendered to exhibit magnetic property different than other portions of the magnetic thin film. This method is applicable to hard disk drive fabrication, allowing very high aerial density information storage.

Figure 1:
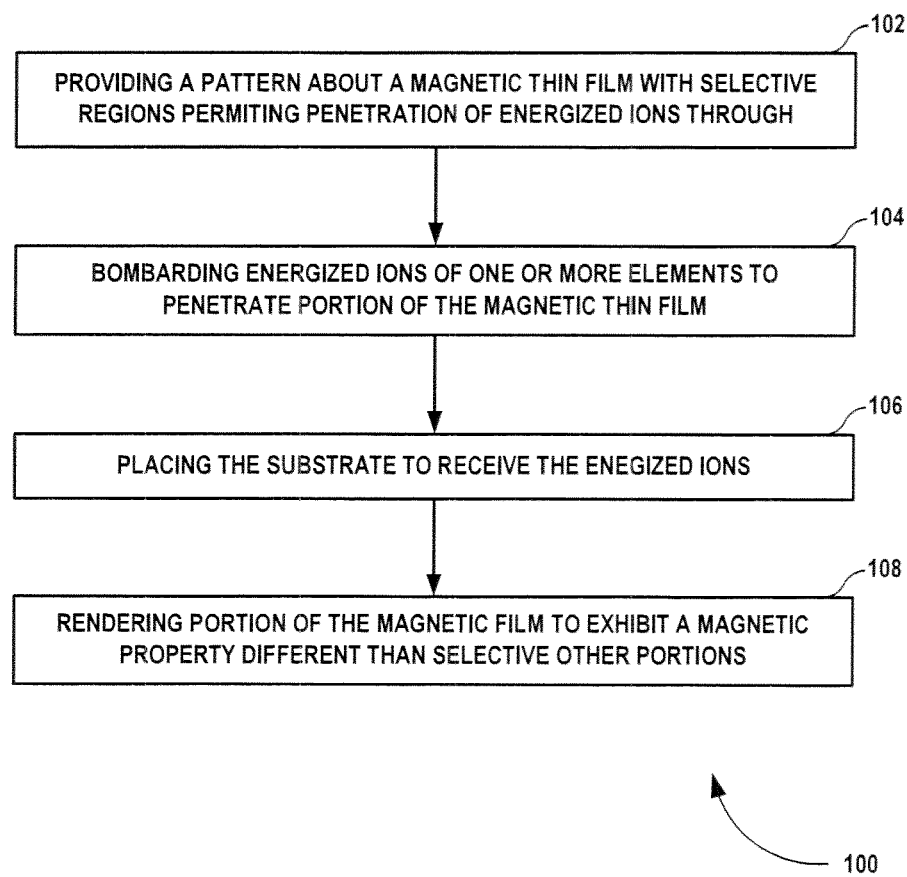
FIG. 1 is process flow chart of an exemplary method of this disclosure.

An exemplary method of the current disclosure is shown in FIG. 1. The method for patterning a magnetic thin film on a substrate includes the following steps: (1) providing a pattern about the magnetic thin film, with selective regions permitting penetration of energized ions of one or more elements; (2) generating energized ions of one or more elements with sufficient energy to penetrate selective regions of the pattern and a portion of the magnetic thin film adjacent the selective regions; (3) placing the substrate to receive the energized ions; and (4) rendering portions of the magnetic thin film adjacent the selective regions to exhibit a magnetic property different than selective other portions of the magnetic thin film.

Figure 2:
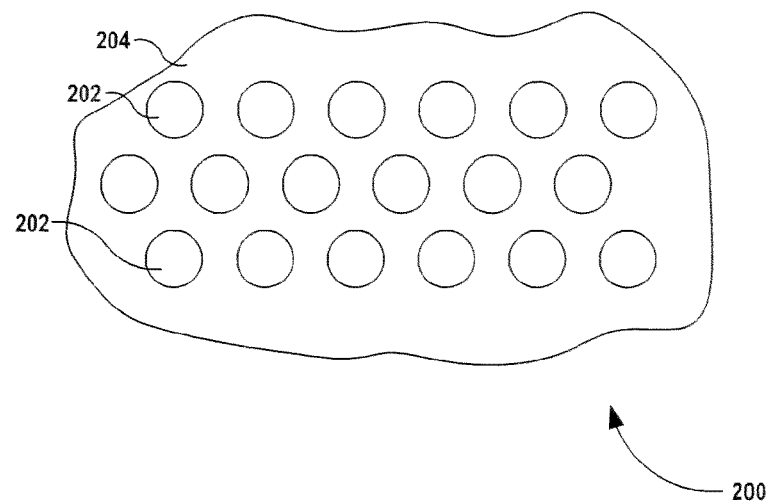
FIG. 2 is a partial plan view of an exemplary mask for use about the magnetic thin film, as a pattern.

In one embodiment, a mask that is not conducive to the penetration of energized ions through with selective regions that permit the penetration of ions through may be used as a pattern. FIG. 2 shows partial plan view of an exemplary mask 200 for use about the magnetic thin film as a pattern. For example, the mask 200 may be made of polymeric material, for example, polyvinyl alcohol (PVA) material with portions 202 not conducive to the penetration of energized ions through and selective regions 204 that are conducive to the penetration of energized ions through. An exemplary method to create PVA templates is described by Schaper in U.S. Pat. No. 6,849,558, which is incorporated by reference herein. The teachings of Schaper may be adapted to create the mask 200 with portions 202 not conducive to the penetration of energized ions through and selective regions 204 that are conducive to the penetration of energized ions through. For example, the thickness of the portions 202 may be chosen such that the energized ions do not penetrate completely through the portions 202. Although portions 202 have been shown to be round, as one skilled in the art appreciates, the shape and location of portions 202 may be beneficially chosen. For example, the shape of portions 202 may be oval, square, rectangular or any other shape depending upon the needs of the application.

In yet another embodiment, a resist may be coated over the magnetic thin film and a pattern created in the resist, for example, using nanoimprint lithography. There are two well known types of nanoimprint lithography that are applicable to the present disclosure. The first is thermoplastic nanoimprint lithography [T-NIL], which includes the following steps: (1) coat the substrate with a thermoplastic polymer resist; (2) bring a mold with the desired three-dimensional pattern in contact with the resist and apply a prescribed pressure; (3) heat the resist above its glass transition temperature; (4) when the resist goes above its glass transition temperature the mold is pressed into the resist; (5) cool the resist and separate the mold from the resist, leaving the desired three-dimensional pattern in the resist.

The second type of nanoimprint lithography is photo nanoimprint lithography [P-NIL], which includes the following steps: (1) a photo-curable liquid resist is applied to the substrate; (2) a transparent mold, with the desired three-dimensional pattern, is pressed into the liquid resist until the mold makes contact with the substrate; (3) the liquid resist is cured in ultraviolet light, to turn the liquid resist into a solid; (4) the mold is separated from the resist, leaving the desired three-dimensional pattern in the resist. In P-NIL the mold is made of a transparent material such as fused silica.

Figure 3:
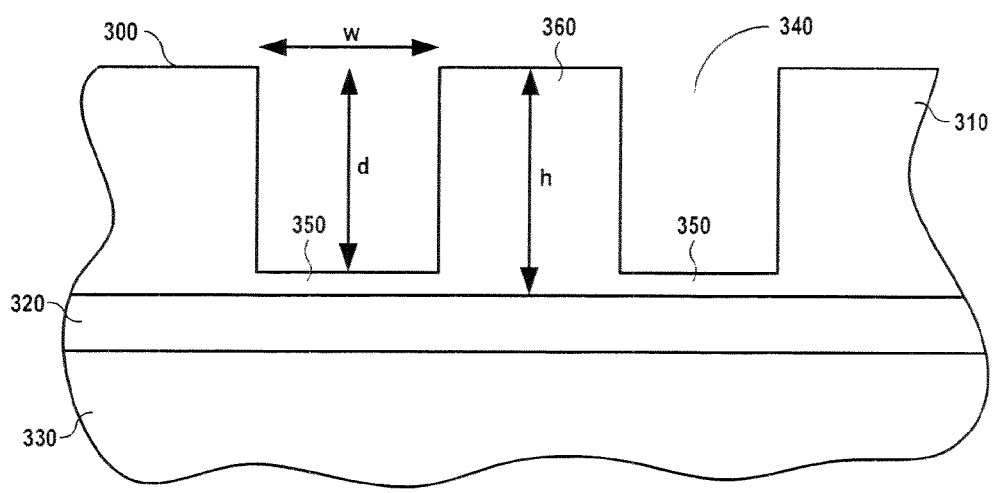
FIG. 3 is an exemplary resist with a pattern disposed about the magnetic thin film.

FIG. 3 shows a cross-sectional representation of an exemplary pattern 300 after nanoimprint lithography. The patterned resist 310 on magnetic thin film 320 on substrate 330 is shown having a depression 340 with selective regions 350 where the resist has been substantially displaced. However, the selective regions 350 have a small amount of resist left covering the surface of the magnetic thin film 320. This is typical for a nanoimprint process. When using a resist pattern as a mask for ion implantation, it is not necessary for the entire resist layer to be removed in the areas where the implant species will be implanted. However, the remaining layer should be thin enough not to cause a substantial barrier for the implant species to penetrate through. Furthermore, the contrast between the areas with thick resist and thin remaining resist should be large enough so the resist in the areas that have the thick resist is capable of stopping the ion species before they reach the magnetic thin film. Alternatively, the thin remaining resist in selective regions 350 can be removed with an isotropic resist removal process such as a descum process or a slight ash process or any other appropriate technique.

In nanoimprint lithography, as the imprint process displaces resist to form selective regions 350, there is a need to control the amount of resist that is displaced when a mold having a plurality of projections corresponding to the depression 340 is brought in contact with the resist and pressure is applied. Typically, the width w of the depression 340 may be about the same dimension as the depth d of the depression 340 and the height h of the resist is at least as high as the depth d of the depression 340, in order to control the amount of resist that is displaced during the stamping process. If the depth d of the depression 340 is substantially higher than the width w of the depression 340, the amount of resist that is displaced may be so high it may be impractical to precisely transfer the pattern from a mold to the resist 310.

The nanoimprint lithography process can be implemented using a full disk nanoimprint scheme, where the mold is large enough to imprint one entire surface. Alternatively, a step and repeat imprint process can be used. In a preferred embodiment, a full disk scheme is used. The nanoimprint process can also be performed with both sides at once. For example, the disk may first be coated with a resist layer on both sides. Then the disk goes into a press where molds are pressed against both sides of the disk to imprint the desired pattern on both sides of the disk simultaneously.

Conventional photolithographic processes may also be used, in which case photoresist is spun on the disks, followed by exposure of the resist through a mask, and development of the exposed resist.

After the patterning, the disks have a pattern of resist with selective regions 350 of the pattern permitting penetration of energized ions through and impinge upon portions of the magnetic thin film 320 adjacent the selective regions 350. Portions of the resist other than the selective regions 350, for example, portion 360 have sufficient thickness to prevent the penetration of energized ions through, thereby preventing the energized ions to impinge upon the magnetic thin film.

If a mask 200 is used instead, the mask 200 is placed adjacent the magnetic thin film and selective regions 204 of the mask 200 will permit the penetration of energized ions through the mask and impinge upon portions of the magnetic thin film adjacent the selective regions 204. In one embodiment, the mask 200 is positioned proximate the magnetic thin film. In another embodiment, the mask 200 is positioned in contact with the magnetic thin film or magnetic thin film covered with a coating. The coating may be conducive to the adhesion of the mask. The coating may also act as a protective coating over the magnetic thin film. The coating may be a carbon layer acting as a protective coating over the magnetic thin film.

Now referring back to FIG. 1, in step 104, energized ions of one or more elements are generated with sufficient energy to penetrate selective regions of the pattern and impinge upon portions of the magnetic thin film adjacent the selective regions. In one embodiment, a vacuum chamber is provided and one or more gases containing compounds of one or more elements are injected. A plasma is ignited by using high voltage and energized ions of one or more elements are released.

In step 106, the substrate is placed to receive the energized ions. In one embodiment, the substrate is placed in a vacuum chamber where energized ions of one or more elements are generated. In one embodiment, the substrate is placed in a plasma containing one or more energized ions. In one embodiment, the substrate is biased to attract the energized ions. If a mask 200 is used, the energized ions pass through the selective regions 204 of the mask 200 and impinge upon portions of the magnetic thin film adjacent the selective regions 204. If a resist 310 is used as a pattern, the energized ions pass through the selective regions 350 and impinge upon portions of the magnetic thin film adjacent the selective regions 350. In one embodiment, the energized ions penetrate into portions of the magnetic thin film adjacent the selective regions 350. In one embodiment, the energized ions partially penetrate into portions of the magnetic film adjacent the selective regions 350. In one embodiment, the energized ions substantially penetrate into portions of the magnetic thin film adjacent the selective regions 350.

In one embodiment, plasma ion implantation may be used to provide high implant doses at low energies. Since the sputtered magnetic thin films are typically only tens of nanometers thick the low ion energies are effective and the high dose provides high throughput. Furthermore, as is clear from FIG. 4, plasma ion implantation of both sides of the disks can be carried out at the same time. Although a double side plasma ion implant is preferred, a single side plasma ion implant can be used without departing from the spirit of the disclosure. In the single side plasma ion implant a first side will be implanted, then the disk will be flipped over and the second side will be implanted.

Figure 4:
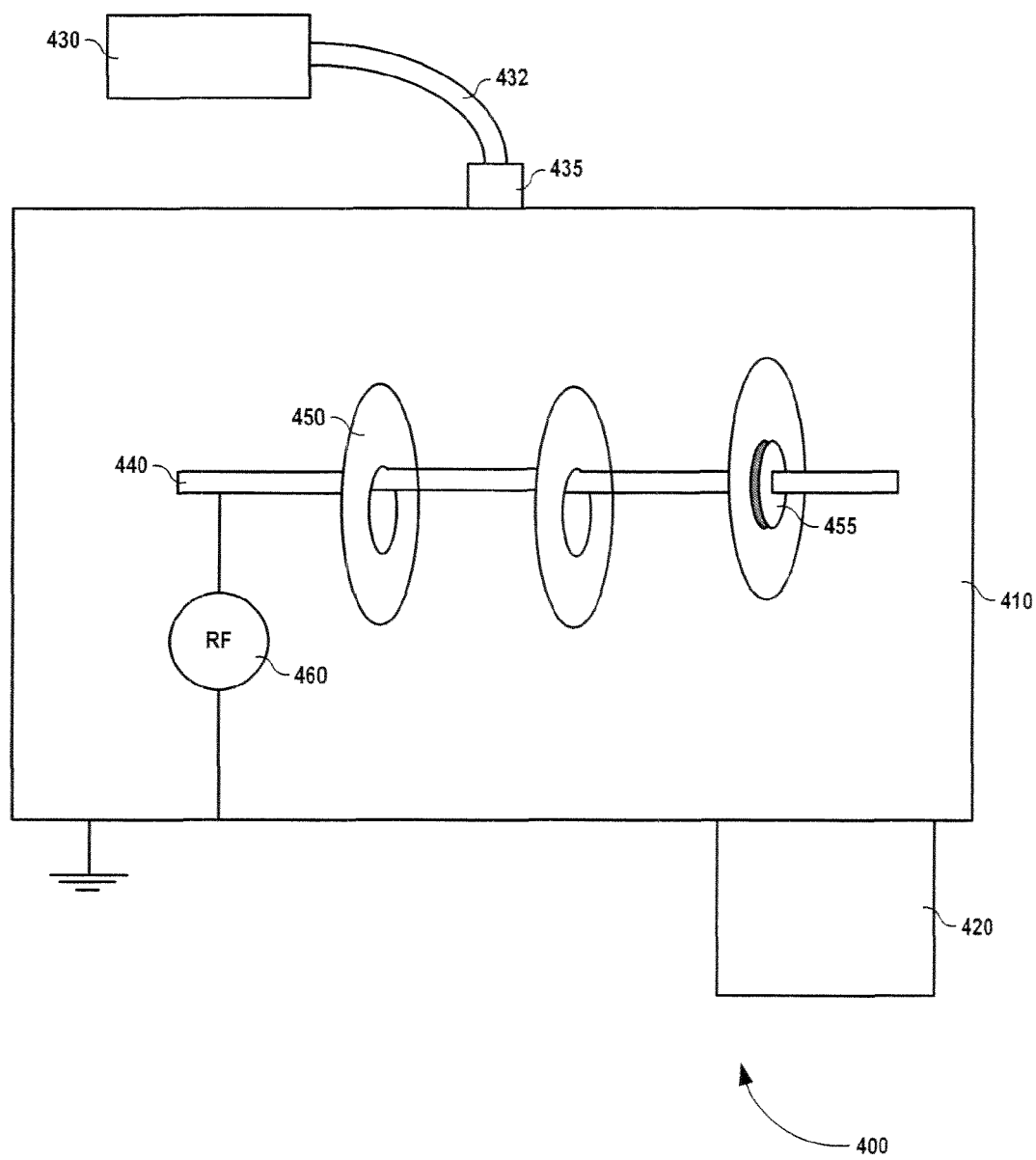
FIG. 4 is a schematic of a process chamber for use with this disclosure, showing a first disk holder apparatus of this disclosure.

A plasma ion implantation tool 400 configured for handling disks, for example, a substrate with a magnetic thin film, with a pattern about the magnetic thin film, with selective regions of the pattern permitting penetration of energized ions of one or more elements through and impinge upon portions of the magnetic thin film is shown in FIG. 4.

Referring to FIG. 4, a chamber 410 is maintained under vacuum by vacuum pump 420. Gas supply 430 is connected by pipe 432 and valve 435 to the chamber 410. More than one gas may be supplied through valve 435 and multiple gas supplies and valves may be used. For example, dopant gases containing one or more species elements may be supplied to the chamber 410. A rod 440 holds disks 450. A radio frequency (RF) power supply 460 is connected between the rod 440 and the wall of the chamber 410. The wall of the chamber 410 is connected to an electrical earth. In addition to the RF power supply an impedance matching device and a power supply for applying a direct current (DC) bias may be included. The rod 440 may be coated with graphite or silicon to protect it from the plasma. Furthermore, the rod and its surface are highly conductive to facilitate a good electrical contact between the rod and the disks. The disks 450 can be fixed in place using clamps 455 or other means; the clamps 455 will not only fix the disks 450 in place but also ensure a good electrical connection between the disks 450 and the rod 440. The rod is configured to carry many disks (only three disks 450 are shown for ease of illustration). Furthermore, the chamber 410 can be configured to hold many rods loaded with disks for simultaneous plasma ion implantation. The rods 440 are readily moved in and out of the chamber 410.

Processing of the disks in the plasma ion implantation tool 400 proceeds as follows. One or more of the disks 450 are loaded onto the rod 440. The rod 440 is loaded into the chamber 410. The vacuum pump 420 operates to achieve a desired chamber pressure. A desired gas containing implant species is leaked into the chamber from gas supply 430 through valve 435 until a desired operating pressure is reached. The RF power supply 460 is operated so as to ignite a plasma which surrounds the surfaces of one or more of the disks 450. The DC power supply can be used to control the energy of ions that are implanted into the magnetic thin film. RF biasing may also be used.

Ions that can be readily implanted from a plasma and that will be effective in modifying the magnetic properties of a typical sputtered magnetic thin films, such as Co—Pt and Co—Pd, are: hydrogen, helium, boron, sulfur, aluminum, lithium, neon and germanium and combinations of these elements. This list is not intended to be exhaustive. Any ion readily formed in a plasma and effective in modifying the magnetic property of a magnetic thin film will suffice. Ideally, the ion that can change magnetic property of the magnetic thin film into thermally stable less magnetic or more magnetic areas at the lowest dose will be preferred.

Further details of plasma ion implantation chambers and process methods are available in U.S. Pat. Nos. 7,288,491 and 7,291,545 to Collins et al., incorporated by reference herein. The primary difference between the chamber of the present disclosure and the chamber of Collins et al. is the different configuration for holding the substrates. The disk holders of the present disclosure allow implantation of both sides at once, whereas the substrates in Collins et al. sit on a wafer chuck during processing. Those skilled in the art will appreciate how the plasma ion implantation tools and methods of Collins et al. can be utilized in the present disclosure.

After placing the substrate to receive energized ions in step 106, the portions of the magnetic thin film adjacent the selective regions are rendered to exhibit a magnetic property different than selective other regions as illustrated in step 108. In one embodiment, the energized ions that penetrate into portions of the magnetic thin film adjacent the selective regions 350 render the portions of the magnetic thin film adjacent the selective regions to exhibit a magnetic property different than selective other regions. The process may additionally include a resist strip step, if a resist is used as a pattern. The resist strip step can be facilitated by a conventional descum and ash operation in the plasma ion implantation chamber prior to removing the disks. The resist strip step may be a wet chemical process that is well known in the art.

If a mask 200, for example, a PVA mask is used, the process may additionally include removal of the mask 200. In one embodiment, the PVA mask may be removed using a process to dissolve the PVA mask 200, for example, using an aqueous solution. In some embodiments, non-aqueous solution may be used.

The energy of ions available from a plasma implantation process is in the range of about 100 eV to about 15 keV. However, for implanting into the magnetic thin films, which are tens of nanometers thick, the desirable energy range is between about 1 keV to about 11 keV. The energy range that is selected is based upon the element chosen, the resist thickness, resist ion stopping capability and the desired magnetic properties. For example, bias voltages of about 1 kV to 11 kV may be used to generate desirable energy range.

Figure 5:
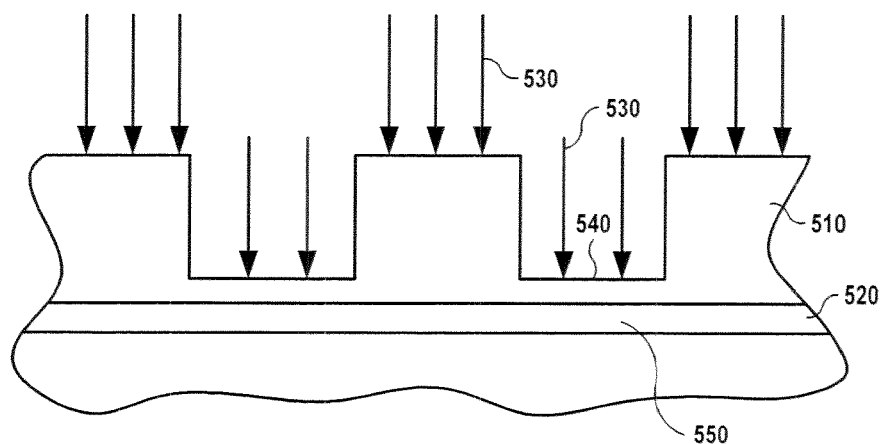
FIG. 5 is a cross-sectional representation of a pattern about the magnetic thin film.

FIG. 5 is a cross-sectional representation of a pattern 510 disposed about the magnetic thin film 520, with arrows 530 representing general direction of bombardment of energized ions. The energized ions penetrate through selective regions 540 of the resist 510 and penetrate a portion 550 of the magnetic thin film 520, adjacent the selective regions 540.

Figure 6:
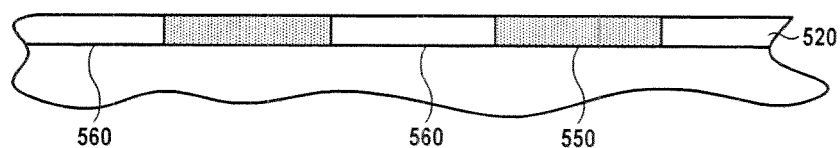
FIG. 6 is a cross-sectional representation of the magnetic thin film, after ion penetration.

FIG. 6 is a cross-sectional representation of the magnetic thin film 520 after ion implantation, with portions 550 subjected to ion implantation. The portions 550 of the magnetic thin film 520 are rendered to exhibit a magnetic property different than selective other portions 560 of the magnetic thin film 520.

Following examples are provided to illustrate various applications of ion implantation to achieve desired magnetic properties.

EXAMPLES

Experiments were conducted to determine ion stopping properties of resist for Helium and Boron ions for a given bias voltage.

Helium ion implant: Experiments were conducted for Helium ion implantation at 7 kV and 2 kV bias voltages. At 7 kV, the resist thickness required to stop the penetration of the Helium ions through the resist layer was about 120 nm. The resist thickness at the selective regions of the pattern can be as high as 45 nm and still provide a penetration of Helium ions through a 20 nm thick Co-based magnetic thin film adjacent the selective regions of the pattern. At 2 kV, the resist thickness required to stop the penetration of the Helium ions through the resist layer was about 85 nm. The resist thickness at the selective regions of the pattern can be as high as 10 nm and still provide a penetration of Helium ions through a 20 nm thick Co-based magnetic thin film adjacent the selective regions of the pattern.

Boron ion implant: Experiment was conducted for Boron ion implantation at 9 kV bias voltage. At 9 kV, the resist thickness required to stop the penetration of the Boron ions through the resist layer was about 65 nm. The resist thickness at the selective regions of the pattern can be as high as 10 nm and still provide a penetration of Boron ions through a 20 nm thick Co-based magnetic thin film adjacent the selective regions of the pattern.

Magnetic Properties

Example 1

A glass substrate sputtered with a FeNi alloy soft under layer of about 100 nm was used. About 20 nm magnetic thin film layer of CoCrPt alloy was sputtered on the FeNi alloy soft under layer. The prepared sample as described above was subjected to a plasma containing He ions, by injecting dopant gas Helium into the process chamber. The process chamber pressure was about 15 mtorr, the RF bias voltage was about 2 kV, the source power was about 500 watts, the dopant gas Helium was injected at a flow rate of about 300 sccm and the implant time was about 25 seconds. Optionally, an inert gas may also be injected to assist in the creation of plasma. For example, Argon at a flow rate of about 16 sccm may also be injected.

Figure 7A:
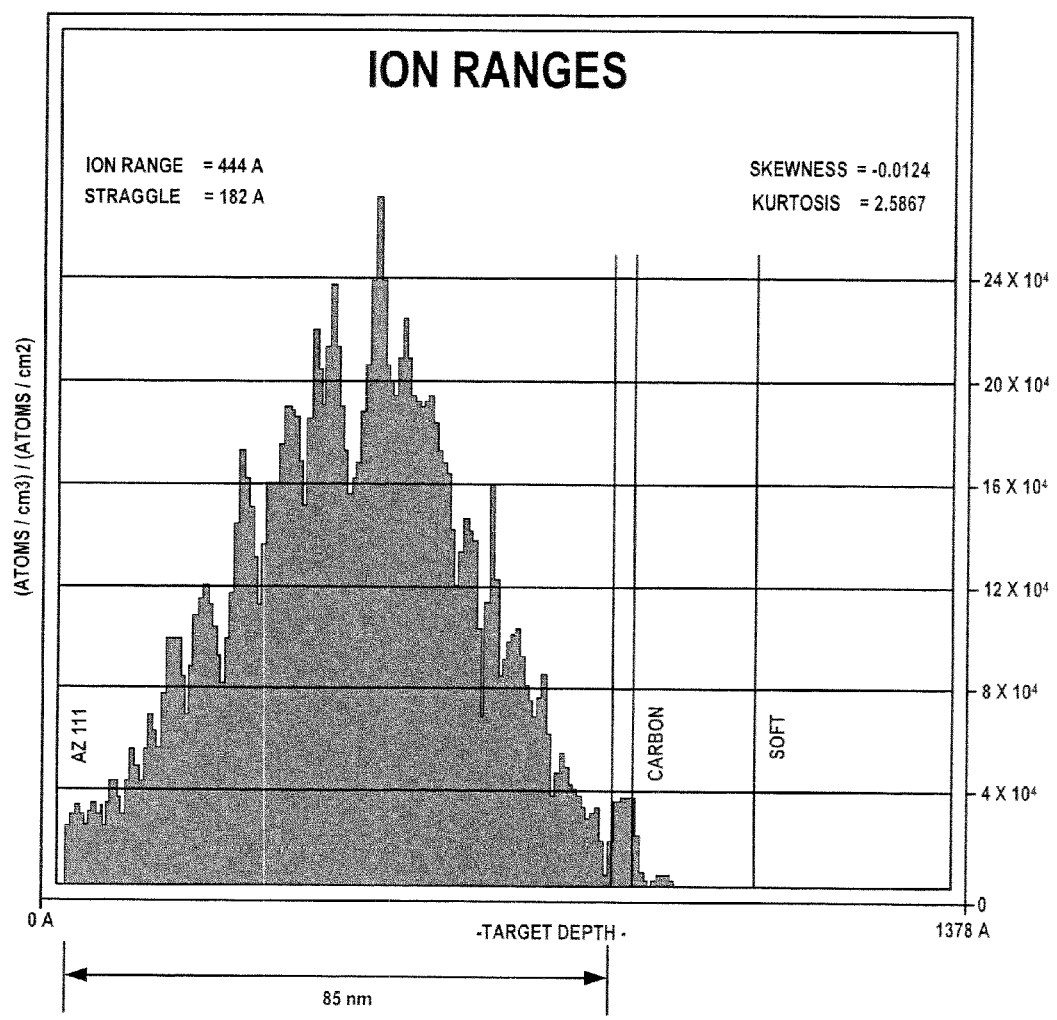
FIGS. 7A and 7B show Helium ion penetration profile through the resist and the magnetic thin film.
Figure 7B:
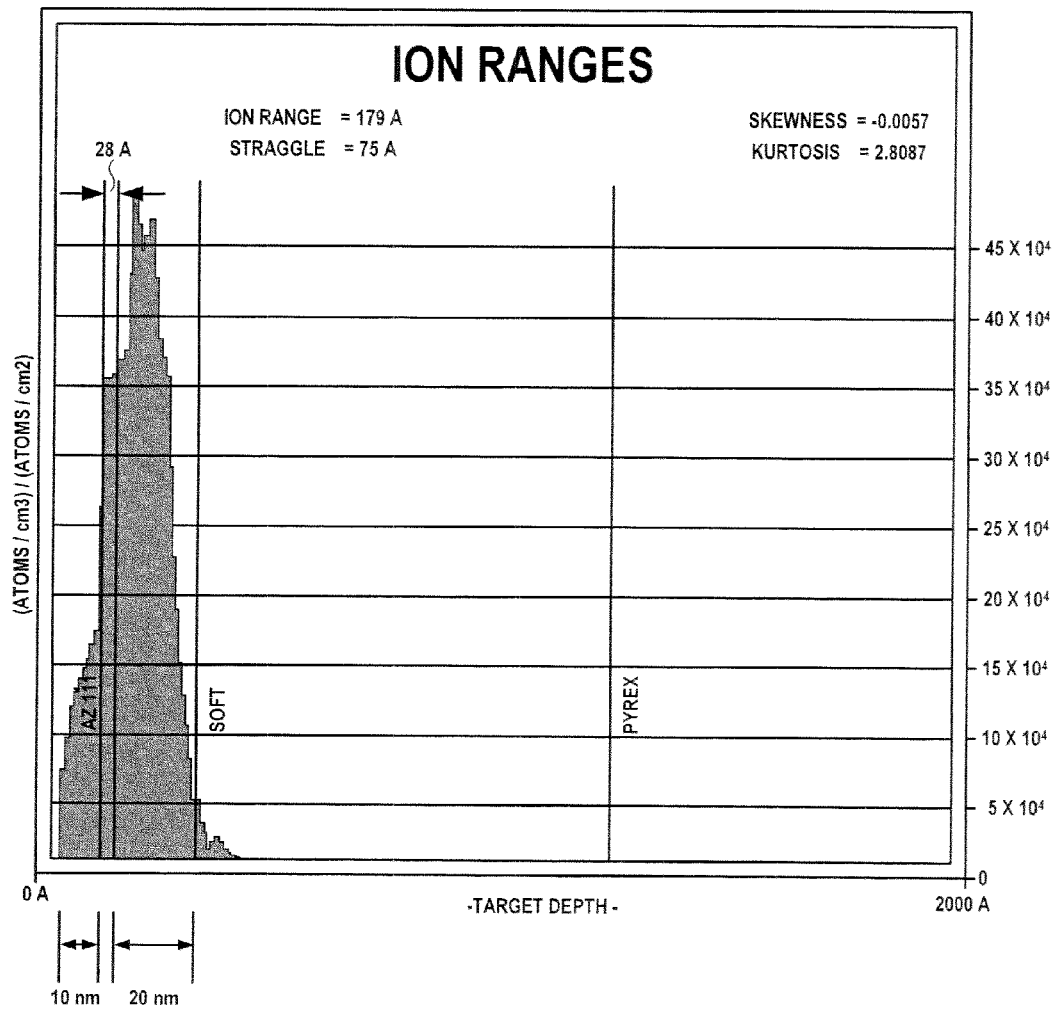

The penetration of the He ions into the sample was profiled using a simulation program with process parameters described above. A simulation program known as TRIM may be used to perform the simulation. TRIM program is available as part of a group of programs known as SRIM from www.srim.org. FIGS. 7A and 7B show the results of simulation. Now referring to FIG. 7A, it is apparent that about 85 nm thick resist will be sufficient to stop energized He ions from penetrating into the CoCrPt magnetic thin film layer. Now, referring to FIG. 7B, it is apparent that about 10 nm of resist layer and about 28 Angstroms of Carbon layer will be successfully penetrated by energized ions and further penetrate substantially through the CoCrPt magnetic thin film layer of about 20 nm.

Figure 7C:
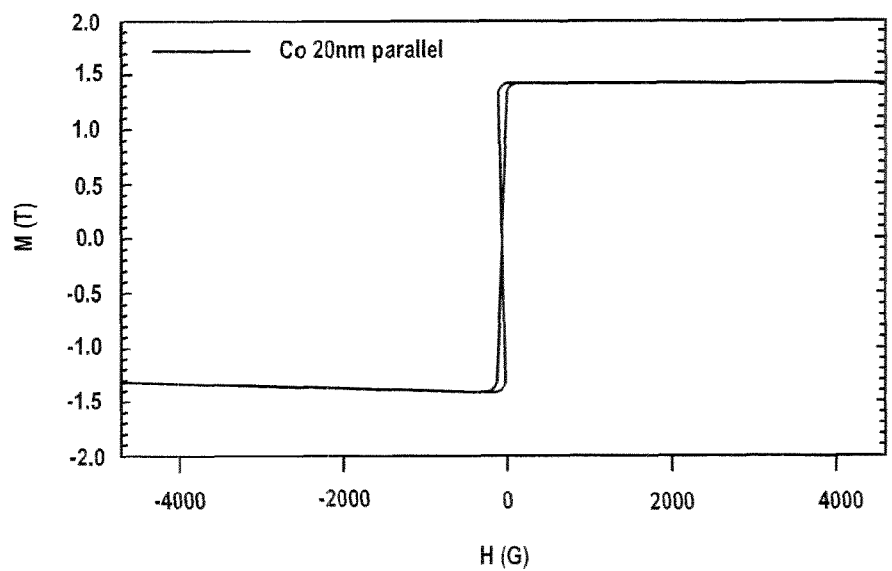
FIG. 7C shows magnetization curve for portion of the magnetic film not subjected to Helium ion implantation.
Figure 7D:
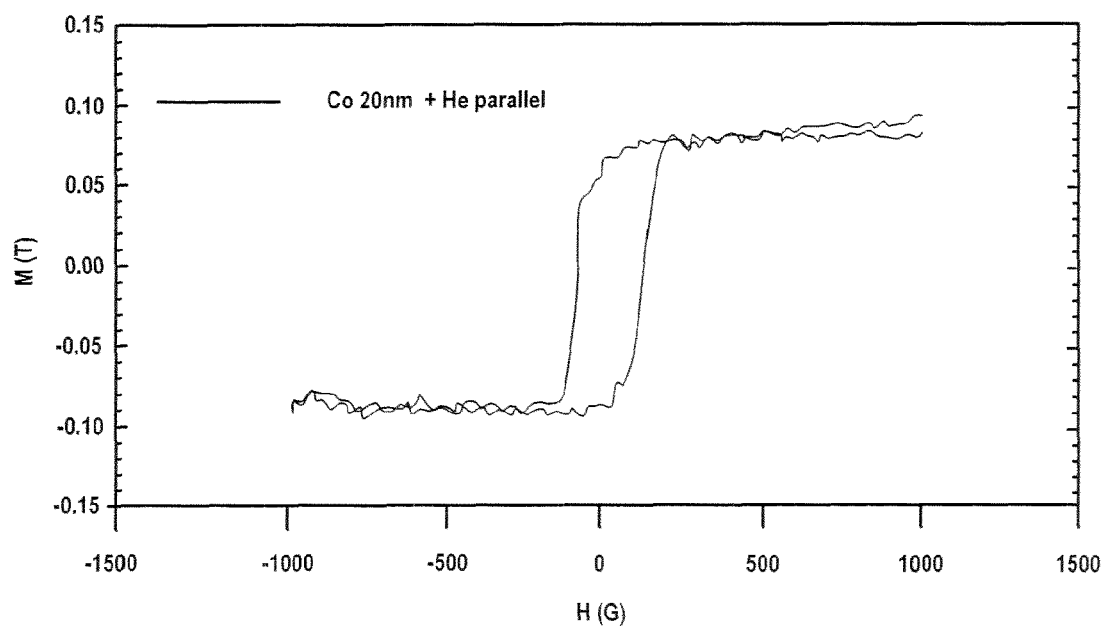
FIG. 7D shows magnetization curve for portion of the magnetic film subjected to Helium ion implantation.

The magnetic properties of the magnetic film for a sample that was not subjected to He ion implantation was measured using Physical Property Measurement System, to establish a base line. After subjecting the sample to He ion implantation, the magnetic properties of portions of the magnetic film subjected to He ion implantation was measured using Physical Property Measurement System. FIG. 7C shows the magnetization curve for magnetic film not subjected to He ion implantation. It is evident from FIG. 7C, the saturation magnetism (Ms) is about 1.36 tesla. FIG. 7D shows the magnetization curve for portions of the magnetic film subjected to He ion implantation. It is evident from FIG. 7D, the saturation magnetism (Ms) for the portion of magnetic film subjected to He ion implantation has dropped to about 0.1 tesla, as compared to base line magnetic thin film not subjected to He ion implantation. Therefore, a magnetic thin film may be subjected to He ion implantation under appropriate process conditions to substantially change the magnetic property to a state where the selective portion exhibits significantly different magnetic property. Although the experiment was conducted at a bias voltage of about 2 kV, the bias voltage may be in the range of 1 kV to 11 kV and preferably in the range of 1 kV to 3 kV.

Example 2

Similar sample as used in Example 1 was used for penetration of Boron ions. The prepared sample as described above, was subjected to a plasma containing boron ions, by injecting dopant gas $BF_3$ into the process chamber. The process chamber pressure was maintained at about 15 mtorr, the RF bias voltage was about 9 kV, the source power was about 500 watts, the dopant gas $BF_3$ was injected at a flow rate of about 300 sccm and the implant time was about 20 seconds. Optionally, an inert gas may also be injected to assist in the creation of plasma. For example, argon at a flow rate of about 16 sccm may also be injected.

Figure 8A:
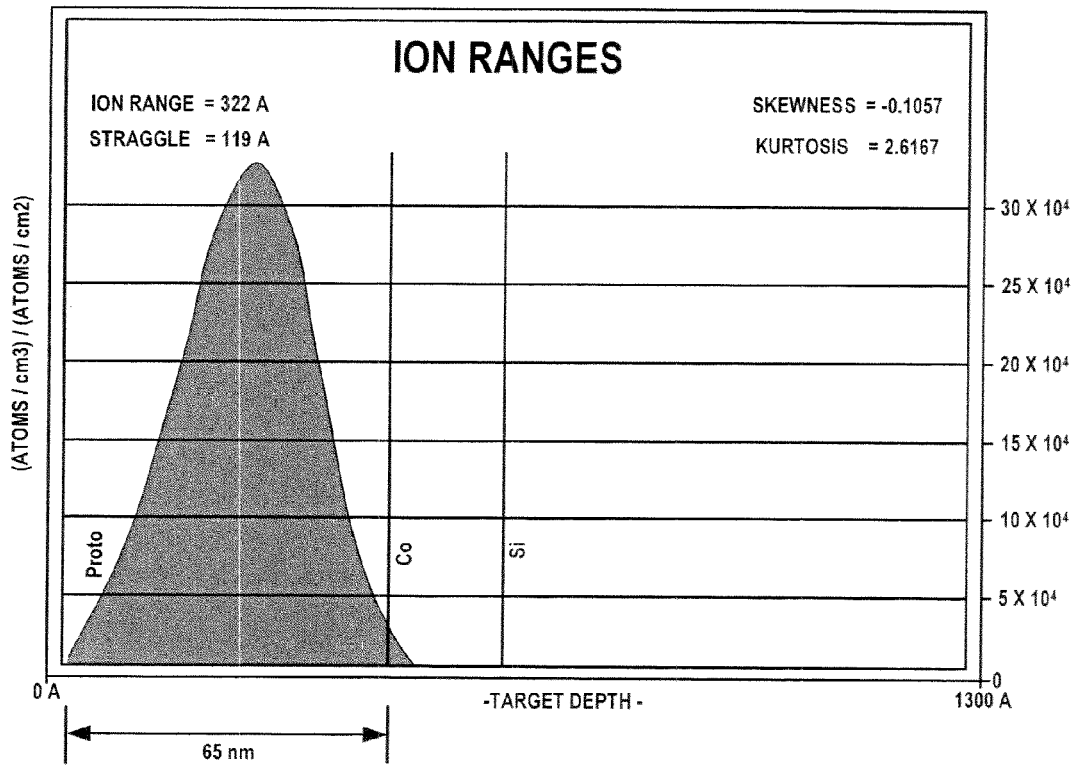
FIGS. 8A and 8B show Boron ion penetration profile through the resist and the magnetic thin film.
Figure 8B:
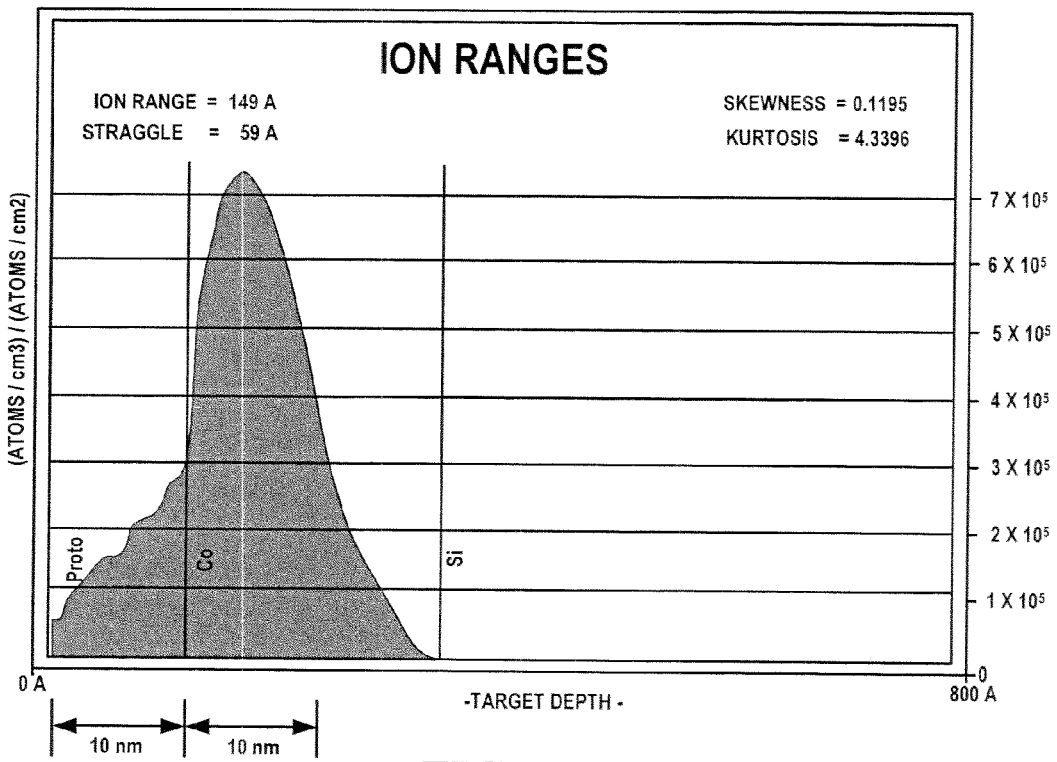

The penetration of the Boron ions into the sample was profiled using a simulation program with process parameters described above. FIGS. 8A and 8B show the results of the simulation. Now referring to FIG. 8A, it is apparent that a 65 nm thick resist will be sufficient to stop energized Boron ions from penetrating into the CoCrPt magnetic thin film layer. It is evident from FIG. 8A that about 10 nm of resist layer and about 28 Angstroms of Carbon layer can be successfully penetrated by energized ions. The energized ions can further penetrate substantially through the CoCrPt magnetic thin film layer of about 20 nm.

Figure 8C:
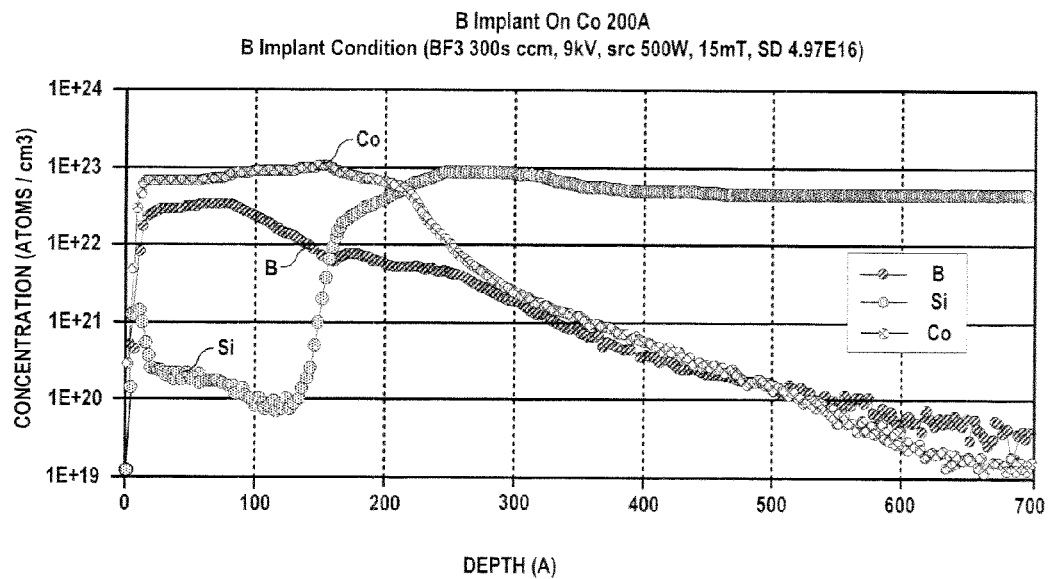
FIG. 8C shows concentration of Boron and Cobalt ions in the magnetic thin film, after Boron ion implantation.

Referring to FIG. 8C, concentration of Boron and Co atoms were determined using Secondary Ion Mass Spectroscope (SIMS). From FIG. 8C, it is evident that Co concentration remained substantially unchanged. It is also evident that Boron concentration remained constant for about 10 nm deep and gradually decreased thereafter.

Figure 8D:
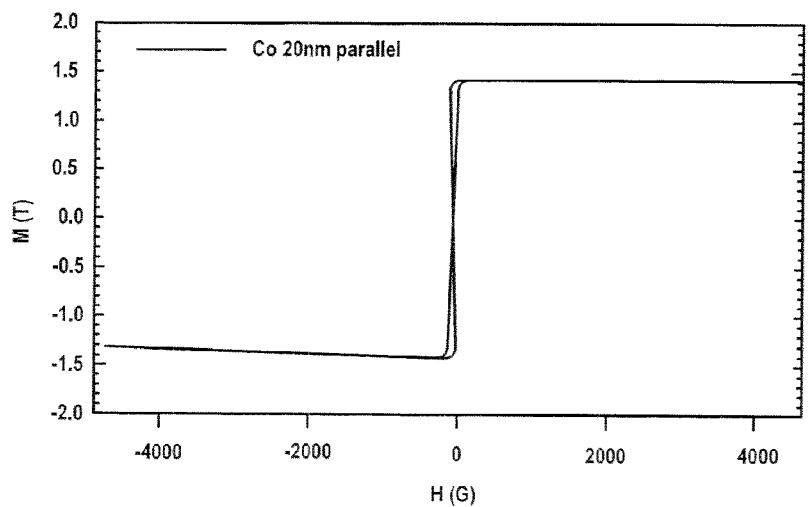
FIG. 8D shows magnetization curve for portion of the magnetic film not subjected to Boron ion implantation.
Figure 8E:
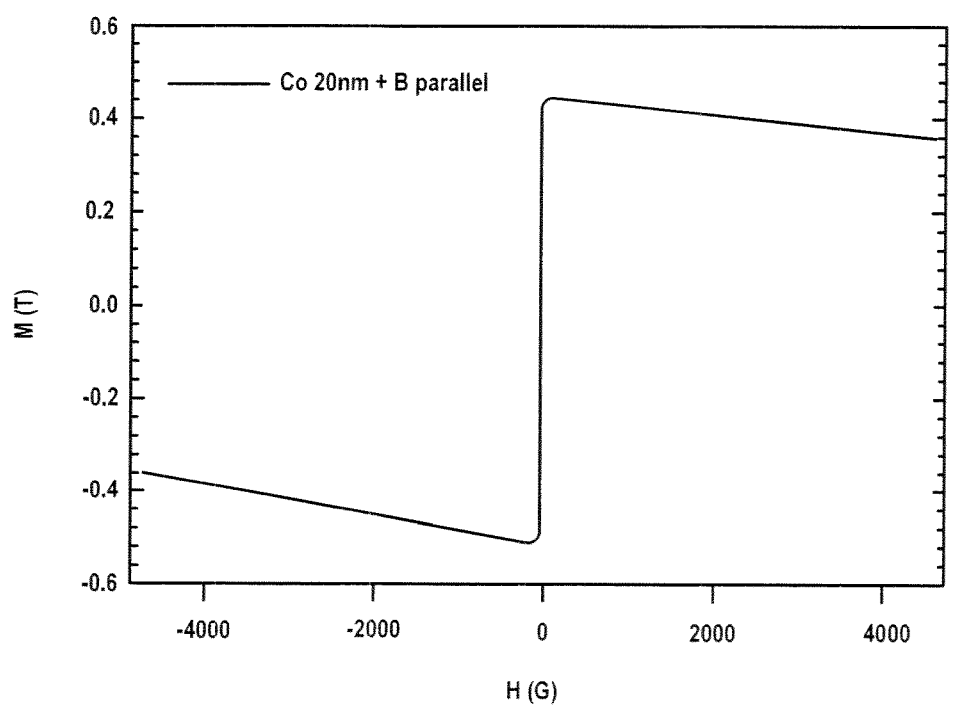
FIG. 8E shows magnetization curve for portion of the magnetic film subjected to Helium ion implantation.

The magnetic properties of the magnetic film for a sample that was not subjected to Boron ion implantation was measured using Physical Property Measurement System, to establish a base line. After subjecting the sample to Boron ion implantation, the magnetic film subjected to Boron ion implantation was measured using Physical Property Measurement System. FIG. 8D shows the magnetization curve for the magnetic film not subjected to Boron ion implantation. As it is apparent from FIG. 8D, the saturation magnetism (Ms) is about 1.36 tesla. FIG. 8E shows the magnetization curve for portions of the magnetic film subjected to Boron ion implantation. As it is apparent from FIG. 8E, the saturation magnetism (Ms) for the portion of magnetic film subjected to Boron ion implantation has dropped to about 0.5 tesla, as compared to magnetic thin film not subjected to Boron ion implantation. The Boron ion implantation under these experimental conditions reduced the magnetization by about 50%.

Therefore, a magnetic thin film may be subjected to Boron ion implantation under certain process conditions to change the magnetic property of the selective portions so as to exhibit different magnetic property. For example, the magnetic property of selective portions may be changed to exhibit less magnetic property than portions not subjected to Boron ion implantation. Although the experiment was conducted at a bias voltage of about 9 kV, the bias voltage may be in the range of 1 kV to 11 kV and preferably in the range of 7 kV to 11 kV.

Example 3

Silicon substrate sputtered with about 20 nm of Co alloy layer was prepared as samples for this example. The prepared sample was subjected to a plasma containing Silicon ions, by injecting dopant gas $SiH_4$ into the process chamber. The process chamber pressure was about 30 mtorr, the RF bias voltage was about 9 kV, the source power was about 500 watts, the dopant gas $SiH_4$ was injected at a flow rate of about 75 sccm and the implant time was about 20 seconds.

Figure 9A:
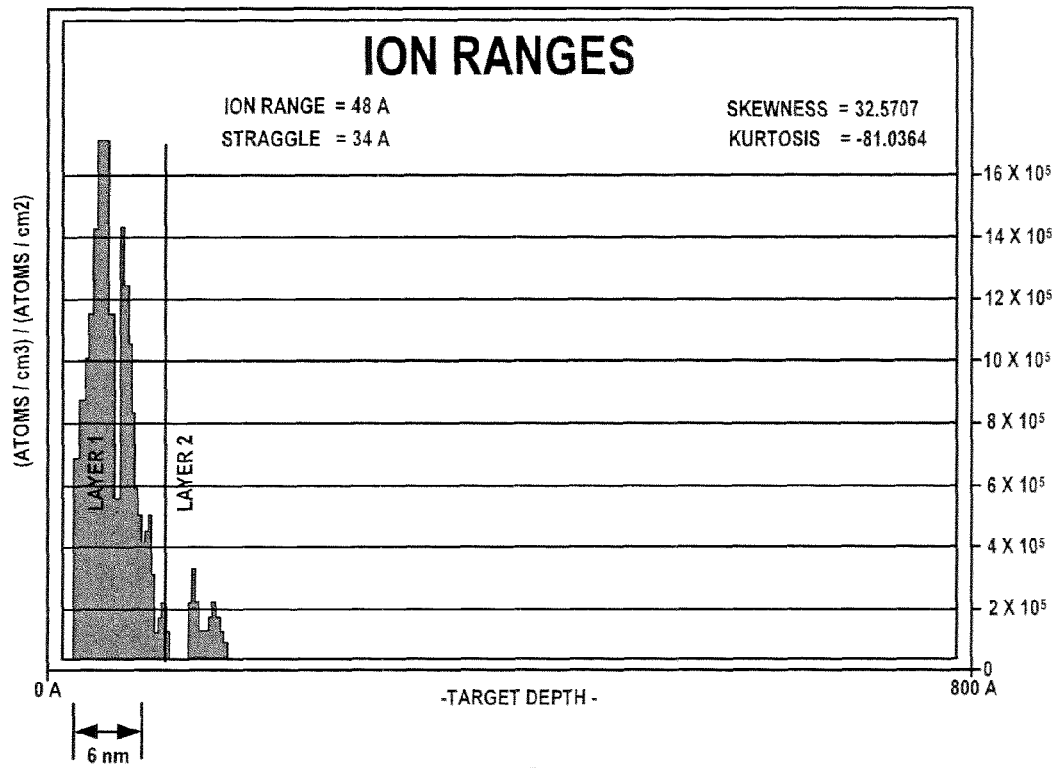
FIG. 9A shows Silicon ion penetration profile through the magnetic thin film.

The penetration of the Silicon ions into the sample was profiled using a simulation program with process parameters as described above. FIG. 9A show the results of the simulation. Now referring to FIG. 9A, it is evident that Si penetrates about 5-6 nm deep, with some tail up to 10 nm deep.

Figure 9B:
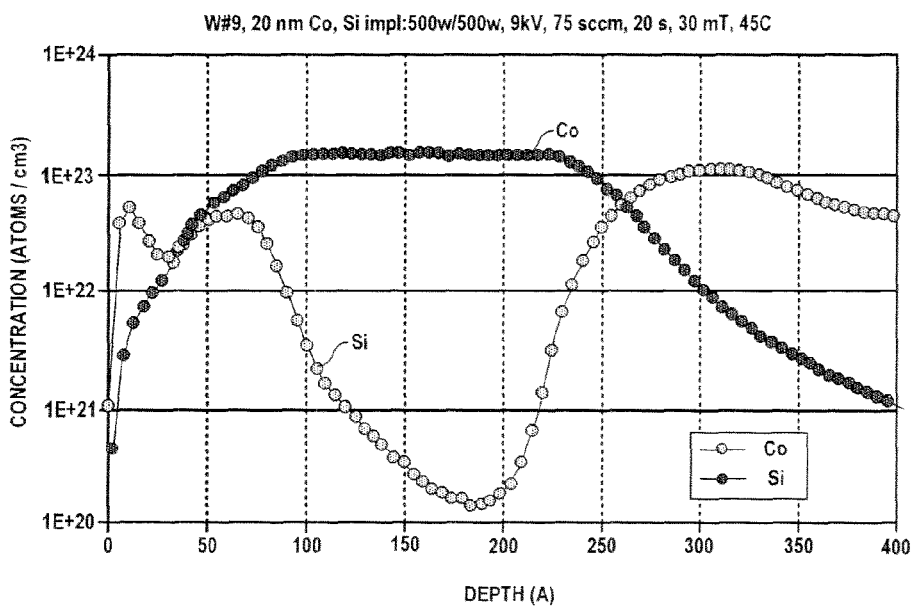
FIG. 9B shows depth profile of Silicon ions in the magnetic thin film, after Silicon ion implantation.

After subjecting the sample to Silicon ion implantation, the depth profile of the Si implant in the 20 nm Co film was measured using SIMS. FIG. 9B shows the depth profile for the Si implant. It is evident from FIG. 9B that Si ions penetrated about 5-6 nm deep. It is noteworthy that Si ion penetration depth profiled using the simulation program correlates well with the actual measurement of the Si penetration depth.

It is evident from the above examples that the resist thickness needed to stop penetration of energized ions through the resist layer and impinge upon the magnetic thin film is dependent upon the element species being used, the process parameters and the desired penetration depth of the ions into the magnetic thin film adjacent the selective regions of the resist layer that permits the penetration of charged ions. As the dimension of the selective regions of the resist layer permitting the penetration of charged ions becomes small, there is a need to reduce the resist thickness, so as to permit effective nanolithography process during the pattern creation. As the resist thickness decreases, the resist layer may no longer be able to stop penetration of energized ions in regions other than the selective regions.

One way to overcome this problem is to add a dopant to the resist that increases the resistance to the penetration of the charged ions. For example, the resist may be doped with a silicon containing compound to increase the resistance to the penetration of charged ions through the resist. Other dopants that may be used to increase the resistance to the penetration of the charged ions include compounds containing sulfur and phosphorus. In one embodiment, nano particles can be added as additives to tune the resistance to the penetration of the charged ions. For example, nano particles of Aluminum oxide ($Al_2O_3$), Silicon dioxide ($SiO2$), Ceria ($CeO_2$) and Titanium dioxide ($TiO_2$) may be used to tune the resistance to the penetration of the charged ions.

It is evident from the above examples that different element species have different effects on the magnetic properties based upon the process parameters and the desired penetration depth of the ions into the magnetic thin film. For example, one or more elements may be advantageously used to modify the magnetic properties of the magnetic film. As an example, a combination of Helium and Boron may provide added benefit. For example, Helium with less molecular weight can penetrate deeper into the magnetic thin film and change the magnetic properties, using less bias voltage. Boron with a higher molecular weight may be used either before or after the penetration of Helium to further impact the magnetic properties of the magnetic thin film and also to act as a barrier for the Helium ions from escaping from the magnetic thin film, over time.

Although the combination of Helium and Boron has been described, one skilled in the art appreciates that various other permutation and combinations of elements may be used in sequence or together, to derive magnetic and other properties that are favorable to the retention and enhancement of the modifications of the magnetic properties.

It is also evident from the above examples that different element species may be used to modify the magnetic properties of the magnetic thin film. For example, a compound containing elements that increase the magnetic property of the thin film upon ion implantation may be used. For example, platinum ion implantation may increase the magnetic properties of the magnetic thin film.

The present disclosure may be used for various types of magnetic recording media. For, example, the teachings of this present disclosure may be used with recording media having a granular magnetic structure. The present disclosure may also be used for magnetic thin films that are multi-layered. The magnetic thin film may also be a continuous magnetic film and may be used with patterned media. The patterned media may be bit patterned media or track patterned media. In one embodiment, the magnetic thin film may be made of highly anisotropic magnetic material, suitable for a thermally assisted magnetic recording.

The present disclosure allows for very short process times. For example, it can take about ten seconds to implant the disks. Input and output vacuum loadlocks will enable rapid transfer of disks in and out of the chamber and avoid losing time for pumpdown, thus allowing for very high throughput. Those skilled in the art will appreciate how automated transfer systems, robotics and loadlock systems can be integrated with the plasma ion implantation apparatus of the present disclosure.

The present disclosure in certain embodiments provides a method to selectively modify the magnetic properties of portions of magnetic thin film of a magnetic media. The selective modifications can be advantageously used to increase one or more of the desirable properties like aerial density, writeability, SNR and thermal stability of the magnetic media.

Although the present disclosure has been particularly described with reference to the preferred embodiments thereof, it should be readily apparent to those of ordinary skill in the art that changes and modifications in the form and details may be made without departing from the spirit and scope of the disclosure. It is intended that the appended claims encompass such changes and modifications.

The invention claimed is:

1. A method for patterning a magnetic media having two sides with a magnetic thin film on both sides, comprising:
   disposing a pattern on the magnetic thin film on both sides of the magnetic media, with selective regions of the pattern permitting energized ions of one or more elements to penetrate through and impinge upon portions of the magnetic thin film;
   generating the energized ions of the one or more elements with sufficient energy to penetrate the selective regions of the pattern and portions of the magnetic thin film adjacent the selective regions on both sides of the magnetic media;
   placing the magnetic media to receive the energized ions; and
   rendering the portions of the magnetic thin film adjacent the selective regions on both sides of the magnetic media to exhibit a magnetic property different than selective other portions of the magnetic thin film, wherein the energized ions of the one or more elements include energized boron ions and energized helium ions, and wherein the energized helium ions and the energized boron ions are implanted at the same bias voltage and the energized helium ions are implanted within the magnetic thin film to a greater depth than the energized boron ions.

2. The method of claim 1, wherein disposing the pattern includes coating a resist over the magnetic thin film and imprinting the resist with a mold having a plurality of projections corresponding to the selective regions of the pattern.

3. The method of claim 1, wherein generating the energized ions of the one or more elements includes injecting one or more gases comprising the one or more elements into a vacuum chamber, igniting a plasma by using high voltage and releasing the energized ions of the one or more elements, and the placing the magnetic media includes positioning the magnetic media in the vacuum chamber and biasing the magnetic media to attract the energized ions.

4. The method of claim 2, further comprising removing the resist.

5. The method of claim 4, wherein the resist is deposited and cured on the surface of the magnetic film using photo nanoimprint lithography.

\* \* \* \* \*